United States Patent [19]

Mehrad

[11] Patent Number: 5,753,952
[45] Date of Patent: May 19, 1998

[54] NONVOLATILE MEMORY CELL WITH P-N JUNCTION FORMED IN POLYSILICON FLOATING GATE

[75] Inventor: Freidoon Mehrad, Plano, Tex.

[73] Assignee: Texas Instruments Incorporated, Dallas, Tex.

[21] Appl. No.: 532,061

[22] Filed: Sep. 22, 1995

[51] Int. Cl.$^6$ ........................................... H01L 29/788
[52] U.S. Cl. ..................... 257/316; 257/315; 257/317; 257/318; 438/264; 365/185.1; 365/185.6
[58] Field of Search ........................... 257/315, 316, 257/317, 318; 365/185.1, 185.6, 185.16; 438/264

[56] References Cited

U.S. PATENT DOCUMENTS

| | | | |
|---|---|---|---|
| 5,412,603 | 5/1995 | Schreck et al. | 257/289 |
| 5,554,552 | 9/1996 | Chi | 437/43 |

FOREIGN PATENT DOCUMENTS

| | | | |
|---|---|---|---|
| 6-61503 | 3/1994 | Japan | 257/316 |

OTHER PUBLICATIONS

Kurylo et al., "Nonvolatile MIS Charge Storage Devices", IBM Technical Disclosure bulletin, vol. 19, No. 3, pp. 871–872, Aug. 1976.

*Primary Examiner*—Valencia Martin Wallace
*Attorney, Agent, or Firm*—Theodore D. Lindgren; Robby T. Holland; Richard L. Donaldson

[57] ABSTRACT

An integrated circuit memory cell (10) is formed with a P-N junction polycrystalline floating gate (13) with a lightly boron doped on the source side (13B) and a heavily arsenic or phosphorous doped on the drain side (13A) plus the channel region (Ch). The cells (10) are formed in an array at a face of a semiconductor body (22), each cell including a source (11) and including a drain (12). An improved over-erase characteristic is achieved by forming a P-N junction (JU) in the floating gate (13). Use of a P-N junction (JU) in polycrystalline floating gate (13) prevents the cell (10) from going into depletion, causes a tighter distribution of erased threshold voltages $V_T$ and improves device life because fewer electrons travel through the gate oxide (30).

6 Claims, 6 Drawing Sheets

NONVOLATILE MEMORY CELL WITH P-N JUNCTION FORMED IN POLYSILICON FLOATING GATE

BACKGROUND OF THE INVENTION

This invention relates to nonvolatile memories of the floating-gate type, such as EPROM or EEPROM devices (Electrically Erasable and Programmable Read-Only-Memory devices). In particular, this invention relates to memory cells having two conducting layers, both usually formed from phosphorous-doped polycrystalline silicon (polysilicon or poly) layers, and to memory cells using channel-hot electrons for programming from the drain side and using Fowler-Nordheim tunnelling for erasure from the source side. The upper conducting layers of such cells form wordlines and control gates. The lower conducting layers of such cells form floating gates.

In many flash EPROM devices of the foregoing type, the cells are erased by grounding the wordlines (and control gates), by allowing the drain-column lines to float and by applying a high positive voltage to the source-column lines. In the erase mode, the high voltage applied to the source-column lines with respect to control gates creates an electric field across the gate oxide (or tunnel-window oxide) of each cell. Ideally, the erasing electric field causes only those electrons that were placed on the polycrystalline floating gate during programming to tunnel (by Fowler-Nordheim tunneling) through the gate oxide from the floating gate to the source diffusion. That is, the erasing electric field should, ideally, not over-erase the floating gate. An over-erased floating gate short-circuits other cells in the same column, which causes errors during the read operation. Also, the unnecessary flow of electrons through the gate oxide during over-erasure tends to cause low cell endurance. Finally, over-erasure causes a wide distribution of erased threshold voltages $V_T$. While the adverse effects of over-erasure are sometimes corrected by forming split channels or by using multi-transistor cells, those require additional cell area and/or additional processing steps.

At present, most floating-gate devices use a double-poly stack structure in which both the floating-gate poly layer and the control-gate/wordline poly layer are doped with phosphorous only. A problem arising from the use of phosphorous-doped polysilicon floating gate is discussed in Ushiyama et al., "Two Dimensionally Inhomogeneous Structure and Gate Electrode/Gate Insulator Interface Causing Fowler-Nordheim Current Deviation in Nonvolatile Memory", 1991 IEEE/IRPS, pp. 331–336. In that article, the authors discuss the deviation in Fowler-Nordheim voltage/current characteristics across the gate oxide between the phosphorous-doped polysilicon floating gate and the source junction of a flash EEPROM device. The deviation is caused by excess phosphorous distribution at grain boundaries in a phosphorous-doped polycrystalline silicon structure. Phosphorous segregation at the polysilicon grain boundaries has been documented, for example, in Wade et al., "Grain Growth Mechanism of Heavily Phosphorous-Implanted Polycrystalline Silicon", J. Electrochem. Soc., vol. 125, pp. 1499–1504, 1978. As the dimensions of floating gates become smaller with lithographic developments, the adverse effects of grain boundaries tend to increase because defects from individual grain boundaries comprise a larger percentage each boundary surface area.

There is a need for a memory cell, and for a process for manufacture of memory cell arrays, that allow a comfortable over-erase margin during the erase, and yet do not adversely complicate the cell-manufacturing process. The memory cell should eliminate the deviation in Fowler-Nordheim voltage/current characteristics caused by excess phosphorous distribution at the grain boundaries of a phosphorous-doped polycrystalline silicon floating gate.

SUMMARY OF THE INVENTION

Accordingly, this invention describes a flash EPROM memory cell with a P-N junction formed in the floating gate. The junction is formed with a P-doped region over the source diffusion (tunnelling area) and with a N-doped region over the drain diffusion and the channel area. The memory cells have an improved over-erase margin, have a narrowed distribution of erased threshold voltages $V_T$, and have better endurance because fewer electrons pass through the gate oxide.

The P-N junction formed in the floating gate has no effect on the cell programming operation. That is, the programming voltages and pulse lengths remain the same. However, the excess electrons in the floating gate of a programmed cell are stored in the N-doped side of the gate, the N-doped side extending over the channel area and the drain diffusion overlap region.

During the erase operation, coupling of the positive source voltage to the P-doped side of the P-N floating gate reduces the P-N junction barrier in the floating gate, which in effect allows the programmed electrons to go easily from the N-doped side of the floating gate to the P-doped side, then tunnel to the source junction. This tends to prevent Flash EPROM memory cells from being over-erased into depletion, thus reducing the number of cells having negative threshold voltages $V_T$ that cause errors in read operation.

In addition to the advantages accruing from use of a P-N junction in the polycrystalline floating gate, use of a heavily phosphorus-doped part of the gate over the channel area results in a faster response time. Contrary to the case of a phosphorous-only-doped polysilicon floating gate, the low concentration of boron in the source-overlap region of the floating gate does not diffuse through the thin oxide gate insulator into the channel region, causing an erratic threshold voltage $V_T$ distribution.

The boron-doped side of the polycrystalline floating gate, which is over the source junction overlap, has fewer "free" electrons than does phosphorous-doped polycrystalline. Therefore, during the erase operation, it is more difficult to pull bonded electrons out from the boron-doped side. Instead, the electrons come from the phosphorous-doped side by overcoming the junction barrier in the floating gate. Therefore, the tendency to over-erase the floating gate is decreased greatly.

Under proper conditions, the intrinsic solution of this invention prevents erased cells from going into depletion and, therefore, eliminates the need for correcting over-depleted cells by means such as compaction.

DETAILED DESCRIPTION OF THE INVENTION

Figure 1:
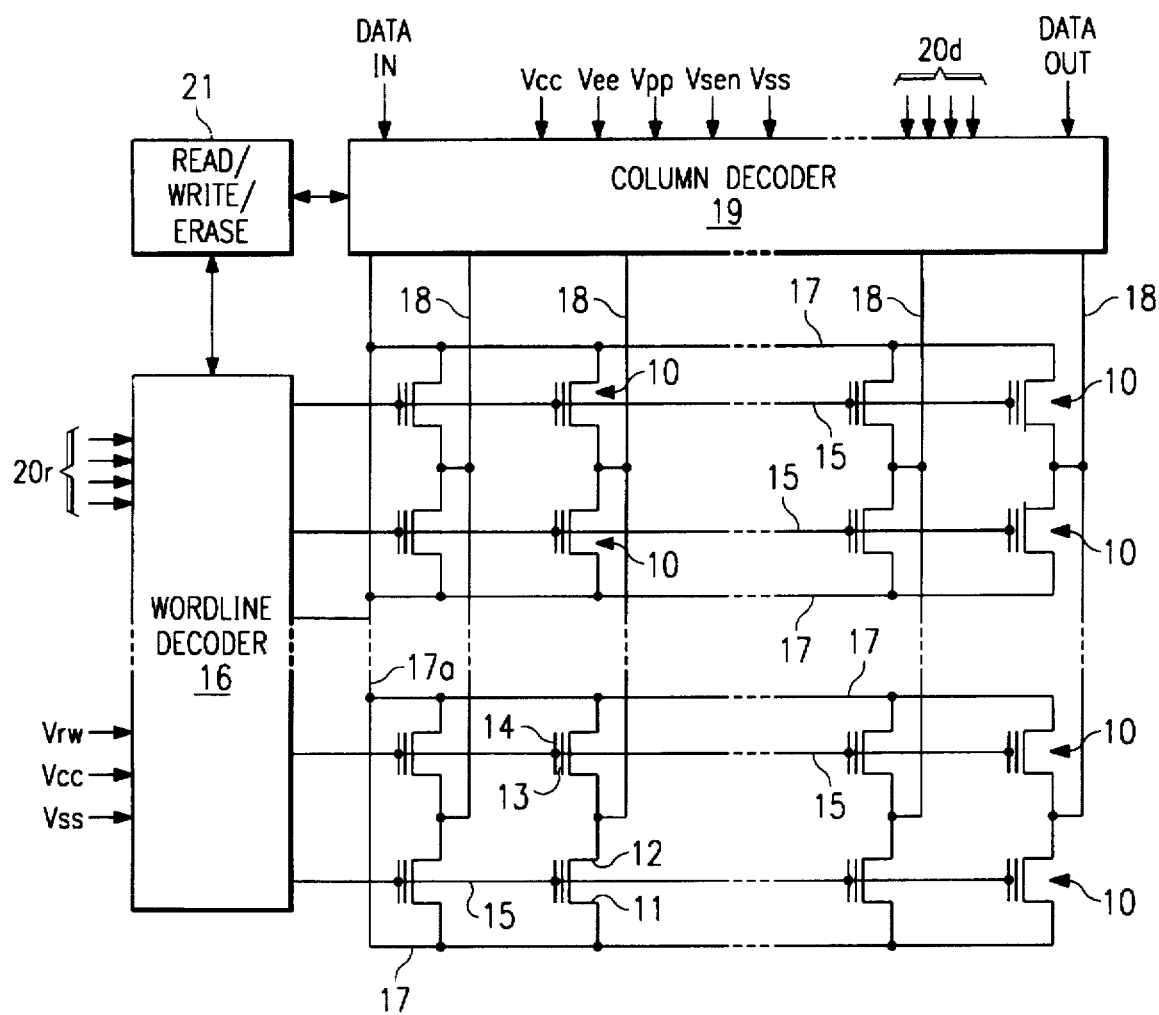
FIG. 1 is an electrical schematic diagram, in partial block form, of a memory cell array.

Referring to FIG. 1, an example array of memory cells, which is an integral part of a memory chip, is shown for the purpose of illustrating use of this invention. Each cell is a floating-gate transistor 10 having a source 11, a drain 12, a floating gate 13 and a control gate 14.

Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a column line 17a to a column decoder 19 and each of the drain-column lines 18 is connected to the column decoder 19.

In a write or program mode, the wordline decoder 16 may function, in response to wordline address signals on lines 20r and to signals from Read/Write/Erase control circuit 21, (or microprocessor 21) to place a preselected first programming voltage Vrw (approx. +12V) on a selected wordline 15, including a selected control-gate conductor 14. Column decoder 19 also functions to place a second programming voltage Vpp (approx. +5 to +10V) on a selected drain-column line 18 and, therefore, the drain 12 of selected cell 10. Source lines 17 are connected to reference potential Vss. All of the deselected drain-column lines 18 are connected to reference potential Vss. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2V to −6V with respect to the channel region. For memory cells 10 fabricated in accordance with the preferred embodiment, the coupling coefficient between a control gate 14/wordline 15 and a floating gate 13 is approximately 0.5. Therefore, a programming voltage Vrw of 12 volts, for example, on a selected wordline 15, including the selected control gate 14, places a voltage of approximately +5 to +6V on the selected floating gate 13. The floating gate 13 of the selected cell 10 is charged with channel-hot electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash erase mode, the column decoder 19 may function to leave all drain-column lines 18 floating. The wordline decoder 16 functions to connect all the wordlines 15 to reference potential Vss. The column decoder 19 also functions to apply a high positive voltage Vee (approx. +10V to +15V) to all the source lines 17. These erasing voltages create sufficient field strength across the tunneling area between gate 13 and the substrate to generate a Fowler-Nordheim tunnel current that transfers charge from the floating gate 13, erasing the memory cell 10. A desirable erased threshold voltage value (which is close to the ultraviolet-erased value) is achieved by this invention and is described later.

In the read mode, the wordline decoder 16 functions, in response to wordline address signals on lines 20r and to signals from Read/Write/Erase control circuit 21, to apply a preselected positive voltage Vcc (approx. +5V) to the selected wordline 15, and to apply a low voltage (ground or Vss) to deselected wordlines 15. The column decoder 19 functions to apply a preselected positive voltage Vsen (approx. +1.0V) to at least the selected drain-column line 18 and to apply a low voltage (0V) to the source line 17. The column decoder 19 also functions, in response to a signal on address lines 20d, to connect the selected drain-column line 18 of the selected cell 10 to the DATA OUT terminal. The conductive or nonconductive state of the cell 10 connected to the selected drain-column line 18 and the selected wordline 15 is detected by a sense amplifier (not shown) connected to the DATA OUT terminal. The read voltages applied to the memory array are sufficient to determine channel impedance for a selected cell 10 but are insufficient to create either hot-carrier injection or Fowler-Nordheim tunnelling that would disturb the charge condition of any floating gate 13.

For convenience, a table of read, write and erase voltages is given in TABLE 1 below:

TABLE 1

|  | Read | Write | Flash Erase |
|---|---|---|---|
| Selected Wordline | 5 V | 12 V | 0 V (All) |
| Deselected Wordlines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

During the erase operation of prior-art flash EPROM memory devices, some bits are over-erased into depletion. These over-erased cells have a negative threshold voltages $V_T$. Negative threshold voltages $V_T$ cause errors in read operation. The reason is that cells with negative threshold voltages $V_T$ are always conductive, resulting in a short across the source-drain paths of all cells 10 connected in parallel.

Figure 2:
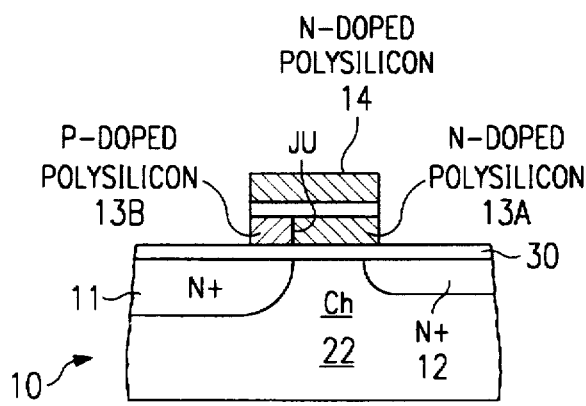
FIG. 2 is a cross-sectional view of a NMOS field-effect transistor with a built-in floating gate consists of P-doped and N-doped regions.

Referring now to FIG. 2, there is illustrated a cross-section view of a NMOS N-channel field-effect device 10 showing a P- doped (boron) silicon substrate 22 separated by an oxide gate insulator 30 from a polysilicon floating gate 13A, 13B. Floating gate 13A, 13B has a P-N junction JU between regions 13A and 13B. The purpose of P-N junction JU is to prevent a cell 10 (a Floating-gate Avalanche-injection Metal Oxide Semiconductor (FAMOS) structure 10) from over-erasing. During the erase operation, the positive voltage Vee applied to the source junction is coupled to the P-doped side 13B of the P-N junction JU in the floating gate, thereby reducing the P-N junction JU barrier and effectively causing the programmed electrons to overcome the junction barrier and to go from the N-doped side 13A to the P-doped side 13B. The programmed electrons then tunnel to the source junction region 11. Due to the existence of the junction JU barrier in the floating gate 13A, 13B, it is harder to pull more native electrons from the N-doped side 13A to the P-doped side 13B. When operated using proper erasing voltages and erasing-pulse lengths, this prevents flash EPROM memory cells 10 from being over-erased into depletion, thus eliminating the number of memory cells 10 having negative threshold voltages $V_T$ that cause errors in read operation. In short, during the erase operation the P-N junction JU makes it more difficult to pull bonded electrons out, which prevents over-erase of the floating gate 13A, 13B when using proper erase conditions.

Figure 3:
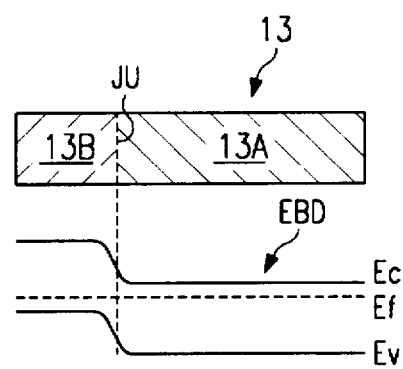
FIG. 3 is a cross sectional view of polycrystalline floating gate of FIG. 2 with the related energy band diagram shown.

Referring to FIG. 3, a cross-section view of the P-N junction JU in the polycrystalline floating gate 13A, 13B of the FAMOS structure 10 of FIG. 2 is illustrated along with a related energy-band diagram depicting the direction of the P-N junction JU barrier.

Figure 4:
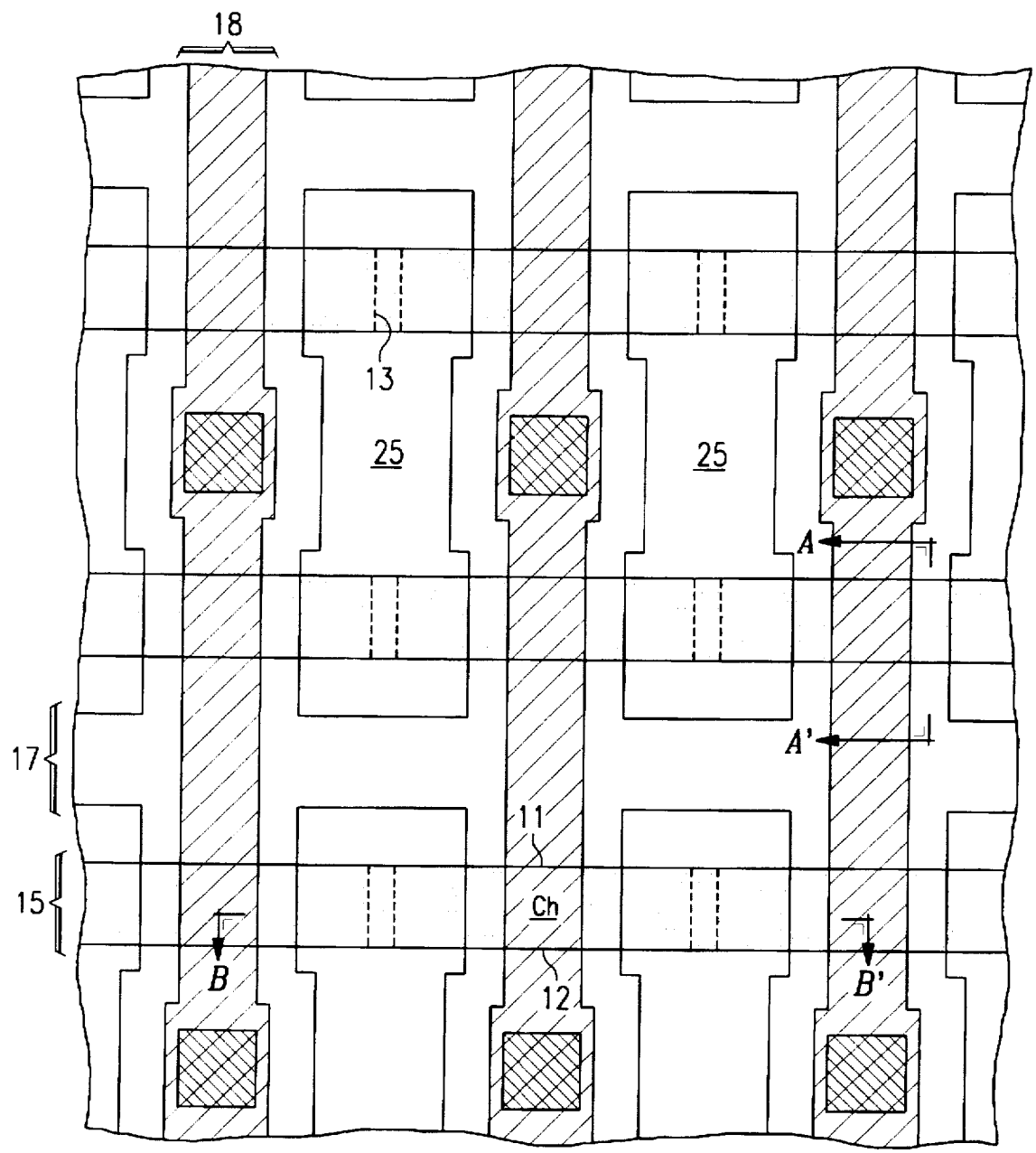
FIG. 4 is an enlarged plan view of a small part of a memory cell array.

Referring to FIGS. 5A-5D and 6A-6D, a method for fabricating the device of FIGS. 1 and 4 is described. The starting material is a slice of P-type silicon of which the substrate 22 is only a small portion. The slice is perhaps eight inches in diameter, while an individual member cell 10 is only a few microns wide and a few microns long. A number of process steps would normally be performed to create transistors peripheral to the memory array, and these will not be discussed. For example, the EPROM memory device may be of the complementary field-effect type (CMOS) having N-wells and P-wells formed in the substrate 22 as part of a prior process to create peripheral transistors.

Figure 5A:
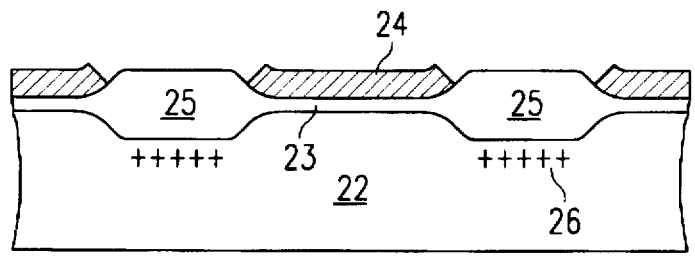
FIGS. 5A–5D are enlarged elevation views of a small part of a memory cell array taken along line B—B' of FIG. 4 during various stages of construction.
Figure 6A:
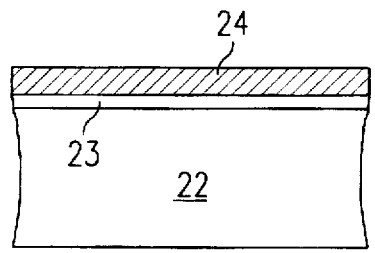
FIGS. 6A–6D' are enlarged elevation views of a small part of a memory cell array taken along line A—A' of FIG. 4 during various stages of construction.

As illustrated in FIGS. 5A and 6A, a pad-oxide layer 23 about 400 Angstroms thick is grown or deposited on the face of substrate 22. The pad-oxide layer protects the substrate 22 during the initial fabrication steps and will be subsequently removed. A silicon-nitride layer 24 is then deposited over the pad-oxide layer 23 using low pressure chemical vapor deposition. The silicon-nitride 24 layer is then patterned and plasma-etched to expose areas where cell-isolation thick field-insulators 25 are to be formed.

A boron implant at a dose of about $7 \times 10^{12}/cm^2$ is performed to create a P+ channel stop region 26 that will isolate the memory cells. After removing the photoresist, the thick field oxide that forms the cell-isolation thick-field insulators 25, as illustrated in FIGS. 5A-5D, is thermally grown in a localized oxidation process to a thickness of about 6000-10000 Angstroms by exposure to steam at about 900° C. and one atmosphere for several hours. Alternatively, a high pressure oxidation (HIPOX) can be used to decrease oxidation time. As is well-known, the oxide grows beneath the edges of the silicon-nitride layer, creating "bird's beak" areas instead of abrupt transitions.

Figure 5B:
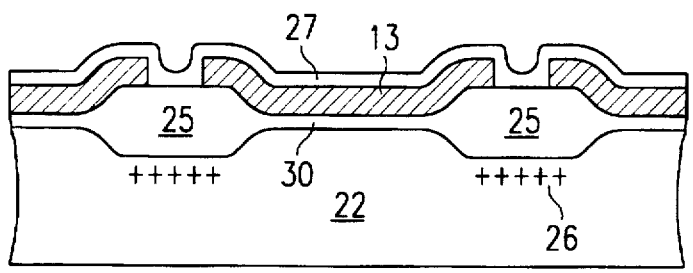
Figure 6B:
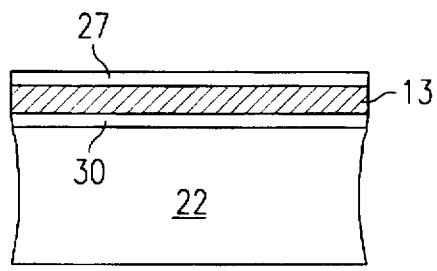

Referring next to FIGS. 5B and 6B, the remaining portions of the pad-oxide and silicon-nitride layers 23 and 24 are removed. The procedure exposes the silicon substrate 22 between the cell-isolation thick-field insulators 25. Following a Kooi oxide process, a cell threshold voltage $V_T$ adjust implant may be performed at this stage using standard procedures, such as boron doping at a dosage of $1 \times 10^{11} - 1 \times 10^{13}/cm^2$ at about 20-60 KeV. This is followed by a Kooi oxide removal and a gate oxidation process using conventional procedures to form gate insulator 30.

At this stage, a layer of polycrystalline silicon (the floating-gate 13 layer) is deposited on the wafer (e.g., 1000-2000 Å). Then this layer 13 is implanted with boron, perhaps through a masking oxide, and is annealed for a short time. The boron doping may be of low dosage and energy, about $20 \times 10^{12}/cm^2$ to $80 \times 10^{12}/cm^2$ at 20 to 30 KeV. Next, the floating-gate 13 layer is patterned and etched resulting in long, parallel strips.

Next, an inter-level insulator layer 27 such as oxide/nitride/oxide (ONO) of equivalent oxide (dielectric) thickness in the range of 200-400 Angstroms is formed over the polycrystalline silicon layer by conventional techniques.

Figure 5C:
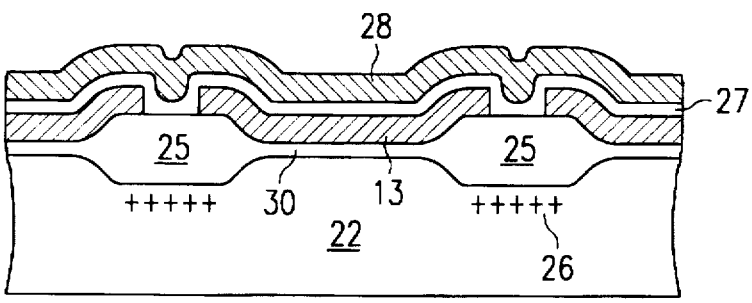
Figure 6C:
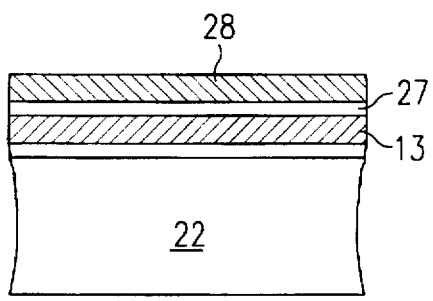

Next, referring to FIGS. 5C and 6C, a N+ doped polysilicon layer 28 perhaps about 1000-2000 Angstroms thick, is formed over inter-level insulating layer 27. The layer 28 includes the future control gates 14 of the cells 10.

Figure 5D:
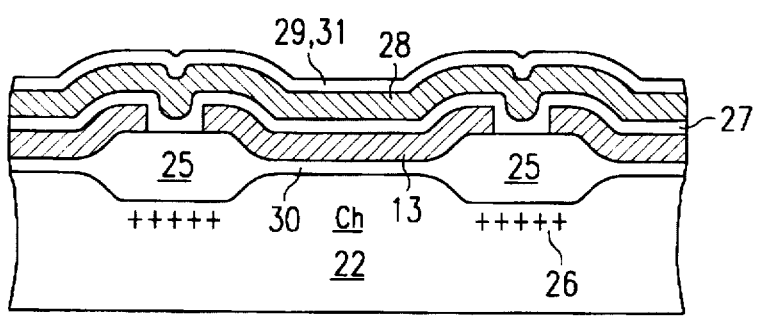
Figure 6D:
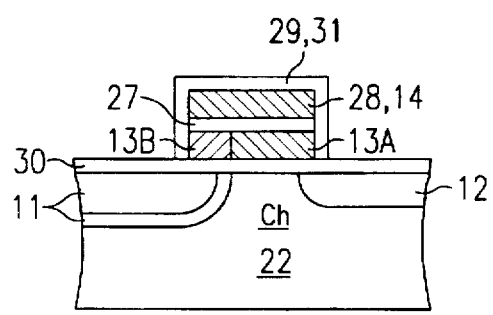

Referring to FIGS. 5D and 6D, a cap oxide layer 29 may be deposited over layer 28. Next, a stack-etch procedure is used to create floating gates 13 and control gates 14 for each of the memory cells 10. Photoresist (not shown) is applied to define floating gate 13 and control gate 14 stacks that include the cap oxide layer 29, layer 28, inter-level insulator 27 and the polycrystalline silicon (floating gates 13). The control gate 14 is capacitively coupled to the respective underlying floating gate 13 through the corresponding portion of the inter-level insulator 27.

The channels Ch formed by the stack etch are configured with a predetermined length, and the stack-etched polycrystalline silicon and layer 28 are used in later fabrication steps as an implant mask to establish the length of the channel regions Ch between source 11 and drain 12. In this manner, the junctions are tailored for optimum efficiency for programming in the drain region 12 and/or erasing in the source region 11.

The next step is to implant phosphorous in source region 11. Photoresist (not shown) is applied to expose the source region 11 to the implant, and the drain region 12 is protected from the source implant. The phosphorous implant is performed at a dosage of about $1 \times 10^{14}$ to $8 \times 10^{14}/cm^2$ at about 30 KeV to 140 KeV and an arsenic implant of about $5 \times 10^{15}/cm^2$ at about 100 KeV. Following the source implant with phosphorous the substrate 22 is annealed at 900°-1000° C. in an annealing ambient to provide phosphorous implanted junction drive as well as repair implant damage.

At this stage, photoresist (not shown) is applied to expose the drain region 12 to the implant, while protecting the source region 11 during the drain 12 implant. Next, arsenic ($5 \times 10^{15}/cm^2$ at about 100 KeV) and boron implants are performed and the substrate 22 is annealed at 900° C. in an annealing ambient to provide junction drive and to repair the implant damage.

An oxide layer 31 may be formed after this process on the sides and top of the stack for improved data retention.

Then photoresist (not shown) is applied to expose the drain region 12 and approximately the right half side of the stack for a high-energy implant. The source region 11 and approximately the left half side of the stack are protected from this implant. Next, arsenic ($20 \times 10^{13}$ to $80 \times 10^{13}/cm^2$ at about 220 to 320 KeV) or phosphorous ($20 \times 10^{13}$ to $80 \times 10^3/cm^2$ at about 100 to 150 KeV) implants are performed to form the N-side (13A) of the P-N junction JU in the floating gate 13A, 13B. This high-energy implant goes deep into the silicon on the drain region 12 but has no adverse effects on the drain electrical performance since the implant is performed toward the end of the process flow and, therefore, does not diffuse under the stack. On the other hand, if this high-energy implant is performed after forming an oxide layer 31 on the sides of stack, the oxide layer 31 keeps the dopants away from the edges of the stack and, therefore, less apt for the dopants to diffuse under the stack.

A borophosphosilicate glass (BPSG) layer (not shown) may then be deposited over the face of the slice. Then BPSG reflow is then performed, which in effect anneals the dopants in the floating gate 13A, 13B and also moves the junction JU in the floating gate 13A, 13B toward the source junction overlap region 11 as shown in FIG. 6D. This BPSG reflow is done at lower temperature and at shorter time, which, in effect, does not cause any diffusion of the high-energy implanted dopants in the drain region. Off-array contacts are made through the BPSG layer, as well as on-array contacts that are made from metal bitlines 18 (FIG. 4) to respective diffused regions periodically in a y-direction. In addition, metal contacts to wordlines 15 are made. The metal bitlines 18 are formed on the BPSG layer to run over and be parallel to diffused regions. This is followed by a protective overcoat process.

Figure 7:
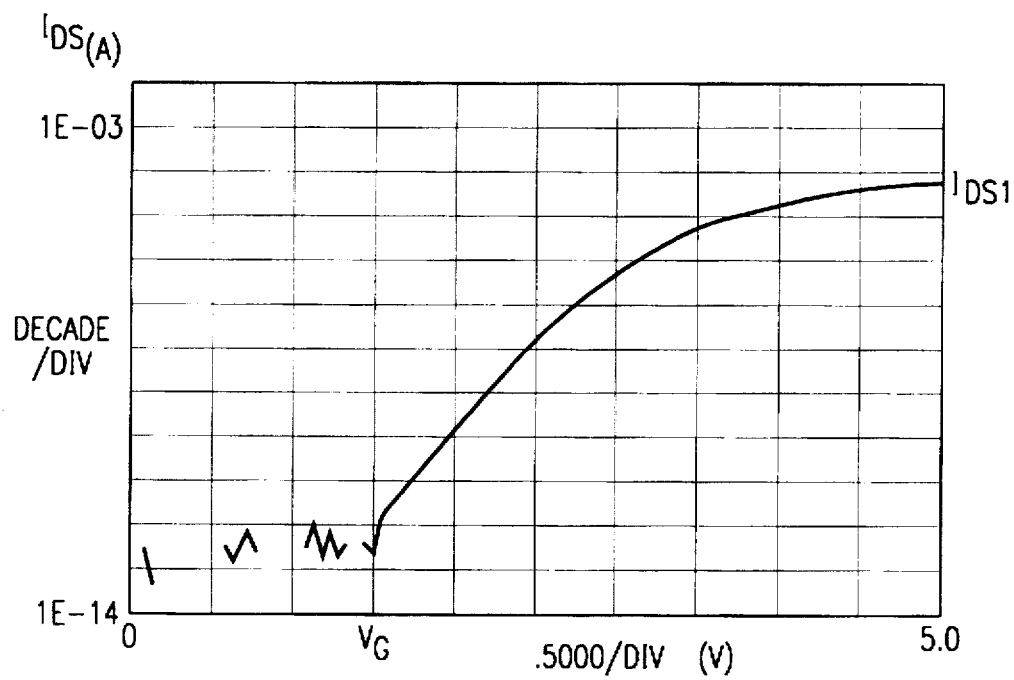
FIG. 7 shows the subthreshold slope of a FAMOS structure with P-N junction floating gate.
Figure 8:
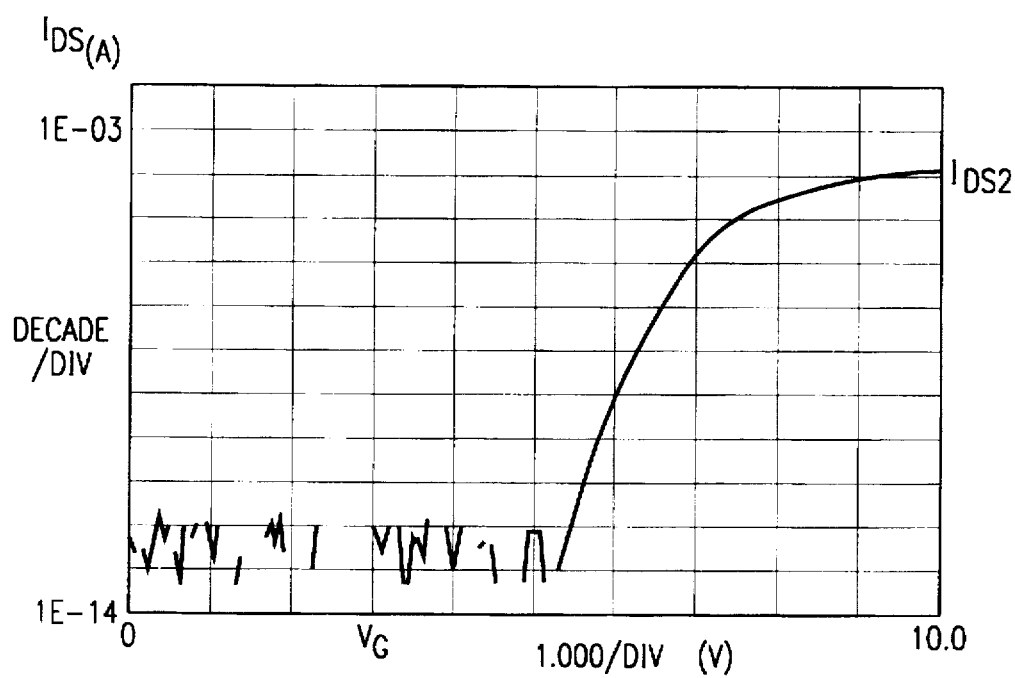
FIG. 8 shows the subthreshold slope of the FAMOS cell of FIG. 7 after programming.
Figure 9:
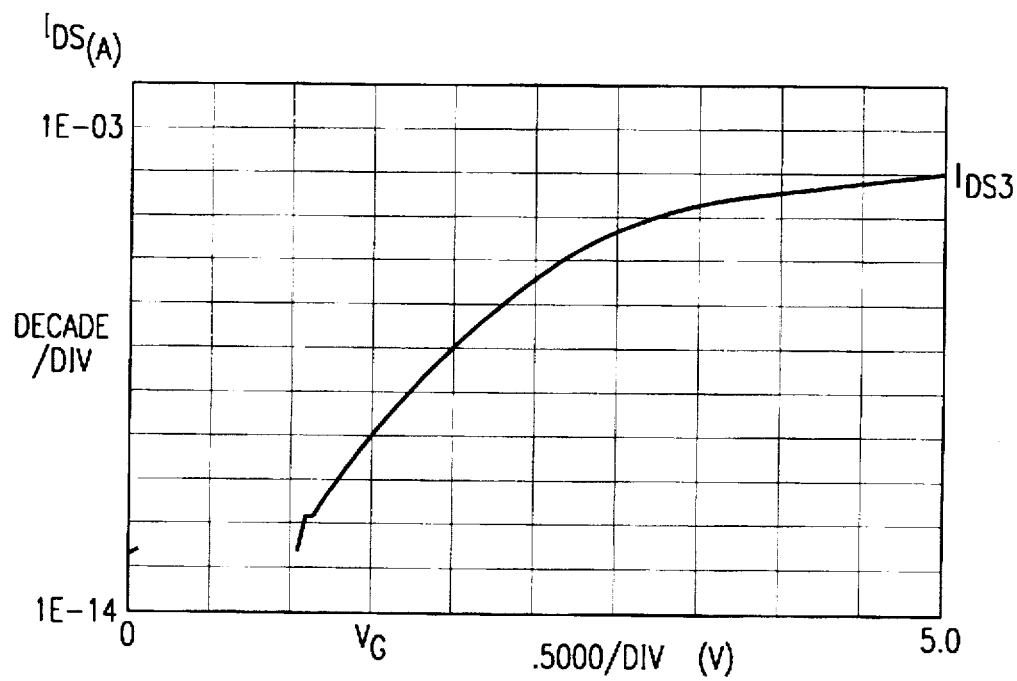
FIG. 9 shows the subthreshold slope of the FAMOS cell of FIG. 8 after 1000 milliseconds of erase.
Figure 10:
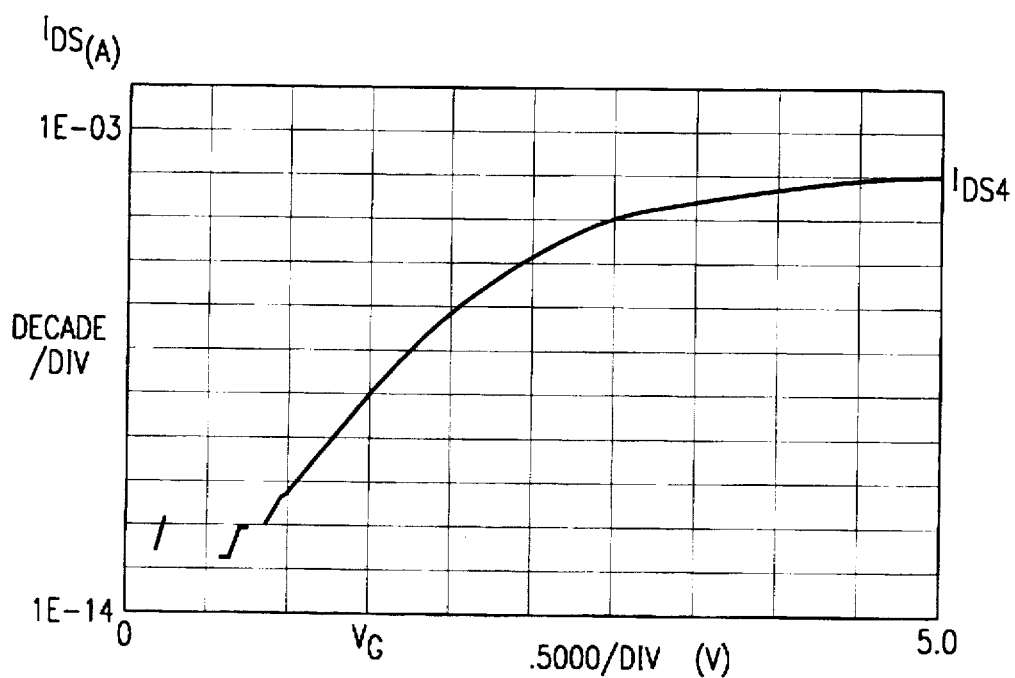
FIG. 10 shows the subthreshold slope of the FAMOS cell of FIG. 9 after a second erase pulse of 1000 milliseconds.

FIG. 7 shows the subthreshold current curve $I_{DS1}$ for a floating-gate cell 10 having an ultraviolet threshold voltage $V_{TUV}$ of 3.15V. The floating-gate cell 10 in FIG. 7 is then programmed to a threshold voltage $V_T$ of 6.89V, and the new subthreshold current $I_{DS2}$ is depicted in FIG. 8. The cell of FIG. 8 is then erased for 1000 milliseconds with a source voltage of 11.4V. The subthreshold current $I_{DS3}$ after erase is shown in FIG. 9 where the erased threshold voltage $V_T$ is measured to be 2.67V, which is slightly less than the ultraviolet threshold voltage $V_{TUV}$. Finally the cell of FIG. 9 is erased for another 1000 milliseconds with the source voltage of 11.4V. As is depicted in FIG. 10, the subthreshold current IDS4 results in a threshold voltage $V_T$ of 2.43V. As can be seen, there is no over-erasure (or depletion) of cells even after 2000 milliseconds of erase.

While the invention has been described with reference to an illustrative embodiment, this description is not meant to be construed in a limiting sense. In particular, this invention applied to all memory cell structures and memory-cell arrays of the floating-gate type, including stack-gate Fowler-Nordheim-tunnel flash-erasable memories and Fowler-Nordheim-tunnel byte-erasable memories. Various modifications and combinations of the illustrative embodiment, as well as other embodiment of the invention, will be apparent to persons skilled in the art upon reference to the description. It is, therefore, intended that the appended claims encompass any such modifications or embodiments.

What is claimed is:

1. A memory cell of the type having a floating gate and a source underlying and insulated from said floating gate, said floating gate chargeable to control the conductivity of a channel adjacent said source, said floating gate comprising:

a first polysilicon region of N-type conductivity;

a second polysilicon region of P-type conductivity;

a P-N junction at the intersection of said first polysilicon region and said second polysilicon region in said floating gate; and said source underlying and insulated from said second polysilicon region of P-type conductivity.

2. The memory cell of claim 1, wherein said memory cell is erased using Fowler-Nordheim tunnelling.

3. The memory cell of claim 1, wherein said floating gate is programmed by channel-hot-electrons.

4. The memory cell of claim 1, wherein said first polysilicon region includes boron doping at a concentration of about $20\times10^{12}/cm^2$ to $80\times10^{12}/cm^2$.

5. The memory cell of claim 1, wherein said second polysilicon region includes arsenic doping at a concentration level of about $20\times10^{13}/cm^2$ to $80\times10^{13}/cm^2$.

6. The memory cell of claim 1, wherein said second polysilicon region includes phosphorus doping at a concentration level of $20\times10^{13}/cm^2$ to $80\times10^{13}/cm^2$.

\* \* \* \* \*